US009089050B2

(12) United States Patent
Kajiya

(10) Patent No.: US 9,089,050 B2
(45) Date of Patent: Jul. 21, 2015

(54) FLEXIBLE CIRCUIT BOARD

(75) Inventor: Atsushi Kajiya, Minato-Ku (JP)

(73) Assignee: Nippon Mektron, Ltd., Minato-Ku (JP)

( * ) Notice: Subject to any disclaimer, the term of this patent is extended or adjusted under 35 U.S.C. 154(b) by 141 days.

(21) Appl. No.: 13/699,883

(22) PCT Filed: Dec. 24, 2010

(86) PCT No.: PCT/JP2010/073385
§ 371 (c)(1),
(2), (4) Date: Jan. 3, 2013

(87) PCT Pub. No.: WO2011/148532
PCT Pub. Date: Dec. 1, 2011

(65) Prior Publication Data
US 2013/0092421 A1 Apr. 18, 2013

(30) Foreign Application Priority Data

May 27, 2010 (JP) ................................. 2010-121519

(51) Int. Cl.
*H05K 1/02* (2006.01)
*H05K 1/03* (2006.01)

(52) U.S. Cl.
CPC ............ *H05K 1/0201* (2013.01); *H05K 1/0206* (2013.01); *H05K 1/0298* (2013.01); *H05K 1/0393* (2013.01); *H05K 2201/047* (2013.01);
(Continued)

(58) Field of Classification Search
CPC ... H05K 1/028; H05K 1/118; H05K 2201/05; H05K 2201/09036; H05K 1/0201; H05K 1/0207; H05K 1/0277; H05K 1/0278; H05K 7/20
USPC .................................. 174/254, 350; 156/221
See application file for complete search history.

(56) References Cited

U.S. PATENT DOCUMENTS 5,268,813 A * 12/1993 Chapman ...................... 361/704
5,375,039 A * 12/1994 Wiesa ............................ 361/720
7,532,479 B2 * 5/2009 Ohno et al. ................... 361/719
(Continued)

FOREIGN PATENT DOCUMENTS

CN     101180925 A    5/2008
JP      05-191013 A1    7/1993
(Continued)

OTHER PUBLICATIONS

Copper and Copper Alloys, copyright 2001, edited by J. R. Davis, ASM International Specialty Handbook, ISBN: 0-87170-726-8 SAN: 204-7586.*
(Continued)

*Primary Examiner* — Timothy Thompson
*Assistant Examiner* — Michael F McAllister

(57) ABSTRACT

The present invention provides a flexible circuit board with a heat dissipation layer on which bending processing can be carried out easily, while achieving its slimming down, and which can maintain the flatness of the heat dissipation layer. The flexible circuit board, at least, has a wiring layer 3a adapted to be electrically connected to a circuit element, an insulating layer 2, and a heat dissipation layer 3b, and which is characterized in that said wiring layer 3a is formed of a copper foil which has a tensile strength of 250 MPa or less and a thickness of 50 μm or less, and said heat dissipation layer is formed of a copper foil which has a tensile strength of 400 MPa or more and a thickness of 70 μm or more.

7 Claims, 7 Drawing Sheets

(52) U.S. Cl.
CPC *H05K 2201/056* (2013.01); *H05K 2201/10106* (2013.01)

(56) References Cited

U.S. PATENT DOCUMENTS

| | | |
|---|---|---|
| 2002/0041032 A1 | 4/2002 | Yamamoto et al. |
| 2003/0089519 A1* | 5/2003 | Okada et al. .................. 174/254 |
| 2008/0099110 A1 | 5/2008 | Muroga et al. |
| 2008/0253145 A1 | 10/2008 | Biarne et al. |
| 2009/0201699 A1* | 8/2009 | Ohno ........................... 362/634 |
| 2009/0226656 A1* | 9/2009 | Crandell et al. ............. 428/40.1 |
| 2010/0270059 A1 | 10/2010 | Takeuchi et al. |

FOREIGN PATENT DOCUMENTS

| | | |
|---|---|---|
| JP | 2537639 Y2 | 6/1997 |
| JP | 2000-167979 A1 | 6/2000 |
| JP | 2002-067221 A1 | 3/2002 |
| JP | 2002-083977 A1 | 3/2002 |
| JP | 2004-351759 A1 | 12/2004 |
| JP | 2006-352103 * | 12/2006 .................... 174/254 |
| JP | 2007-294619 A1 | 11/2007 |
| JP | 2009-172996 A1 | 8/2009 |
| JP | 2010-045325 A1 | 2/2010 |
| JP | 2010-100887 A1 | 5/2010 |
| TW | 201008403 A1 | 2/2010 |
| WO | WO 2006/123783 * | 11/2006 |
| WO | WO 2007/141729 * | 12/2007 |
| WO | WO 20071141729 * | 12/2007 |

OTHER PUBLICATIONS

International Search Report dated Mar. 1, 2011.
Chinese Office Action (With English Translation), Chinese Application No. 201080067037.6, dated Dec. 1, 2014 (11 pages).
Taiwanese Office Action, Taiwanese Application No. 20110118315, dated Mar. 30, 2015 (5 pages).
Extended European Search Report (Application No. 10852197.2) dated May 8, 2015.
Taiwanese Office Action (With English Translation), Taiwanese Application No. 20110118315, dated Mar. 30, 2015 (8 pages).

* cited by examiner

FLEXIBLE CIRCUIT BOARD

BACKGROUND OF THE INVENTION

1. Field of the Invention

The present invention relates to a flexible circuit board, and in particular, to a flexible circuit board which is excellent in heat dissipation.

2. Description of Related Art

In the past, flexible circuit boards have been known as circuit boards on which circuit elements are mounted. A flexible circuit board is one in which a wiring layer of a copper foil, etc., is formed on a surface of an insulating film as a substrate, and has characteristics that it is light in weight, thin in thickness, and is able to be bent in a flexible manner. As a result, in recent years, flexible circuit boards are used not only for electronic equipment but also for lighting equipment, etc., which uses an LED (Light Emitting Diode) as a light source, for example.

On the other hand, in recent years, a demand to the operation of electronic equipment, the high speed and advancement of control, or an increase in the light emitting luminance of lighting equipment is increasing more and more, and hence, in order to meet such a demand, a large current may be caused to flow through a flexible circuit board. However, in cases where a large current is caused to flow through the flexible circuit board, an electric resistance connected to a wiring layer increases, or an amount of heat generated from a circuit element such as a light emitting device increases, as a result of which there arises a problem in which the circuit element may be damaged by thermal runaway, or the life span of the circuit element becomes short.

Accordingly, as a means for radiating or dissipating heat generated in a wiring layer or a circuit element, there has been known a construction in which a heat dissipation plate such as an aluminum plate is laminated on a back surface of a portion of a circuit board on which the circuit element is mounted. By mounting such a circuit board in a manner so as to make the heat dissipation plate in intimate contact with a housing of equipment, it becomes possible to cause the heat generated in the circuit element to escape to the housing through the heat dissipation plate. Here, note that related techniques are disclosed in a first through a third patent document, as listed below.

PRIOR ART REFERENCES

Patent Documents

First Patent Document: Japanese patent application laid-open No. H5-191013
Second Patent Document: Japanese utility model registration No. 2537639
Third Patent Document: Japanese patent application laid-open No. 2000-167979

SUMMARY OF THE INVENTION

Problems to be Solved by the Invention

However, in the above-mentioned conventional technique, there are the following problems.
<Problem 1: Occurrence of Warp>
In cases where a wiring layer is formed of a copper foil which has a representative or central value of a coefficient of linear expansion of $17 \times 10^{-6}$/K and a thickness of 35-70 μm, and in contrast to this, in cases where an aluminum plate having a central value of a coefficient of linear expansion of $23 \times 10^{-6}$/K and a thickness of 1-3 mm is adopted as a heat dissipation plate, a so-called bimetal structure is formed by the wiring layer and the heat dissipation plate which are formed of materials different from each other with respect to their thicknesses and their coefficients of linear expansion, respectively. As a result, a warp occurs in the aluminum plate in the case of a temperature rise, and the area of intimate contact between the aluminum plate and the housing of the equipment decreases. Therefore, the heat dissipation or radiation performance of the aluminum plate decreases, so that the heat generated in the circuit element can not be dissipated or radiated to a sufficient extent.
<Problem 2: Increase in Thickness>
In cases where the aluminum plate is adopted as the heat dissipation plate, in order to ensure sufficient heat dissipation, it is necessary to set the thickness of the aluminum plate to 1-3 mm, as a result of which the circuit board as a whole becomes thick. Moreover, if an insulating adhesive layer for adhering the aluminum plate to the circuit board is made thick in order to prevent exfoliation of the aluminum plate, which would be generated due to warpage of the aluminum plate, the circuit board as a whole will become still thicker.

In contrast to this, the equipment with the circuit board mounted thereon is made to slim down in units of 100 μm, and hence, the adoption of the circuit board with such a thickness becomes a factor which obstructs slimming down of the equipment. Note that herein is described the case where the aluminum plate is used for the heat dissipation plate, but besides, there is also known an arrangement in which a ceramic substrate, a metal substrate using a thick copper plate, or the like, is adopted as the heat dissipation plate, and in such a case, too, there is a problem that the thickness of the entire circuit board increases, similar to the aluminum plate.
<Problem 3: Difficulty in Shape Processing>
Depending on the equipment on which the circuit board is mounted, it is necessary to perform bending processing on the circuit board along the shape or profile of the housing of the equipment (the first patent document). However, in cases where an aluminum plate, a ceramic substrate, or a metal substrate is adopted as the heat dissipation plate, when bending processing is carried out, there will be a high possibility that a crack, fracture, or breakage (disconnection) of the wiring layer occurs, and as a result, the circuit board can be used only in a flat plate shape. Accordingly, it leads to mechanical dimensional obstacles for the equipment. Here, note that there has also been known a method in which a slit is formed in a bent portion of the aluminum plate so as to make it easy to bend the aluminum plate, but in this case, there will be a problem that heat transfer or conduction is obstructed at the slit, thus reducing the heat radiation or dissipation performance of the aluminum plate (the second patent document).
<Problem 4: Maintenance of Flatness>
A proposal has been made for using a flexible circuit board which adopts a thin copper foil as a heat dissipation layer, instead of the aluminum plate, the ceramic substrate or the metal substrate as referred to above. The heat transfer rate of aluminum is 160 W/m-K, in contrast to the fact that the heat transfer rate of copper is 394 W/m-K, and hence, in cases where the thin copper foil is used as the heat dissipation layer, it is possible to ensure sufficient heat dissipation performance which is not inferior to that of the aluminum plate, while making thin the thickness of the flexible circuit board as a whole.

Further, because the wiring layer is also formed of a copper foil, the wiring layer and the heat dissipation layer are formed with the same kind of material, and so, the above-mentioned problem of warpage of the heat dissipation plate and the above-mentioned problem of the increase in the thickness thereof can be solved. Moreover, in cases where the copper foil is used for the heat dissipation layer, it becomes possible to apply bending processing to the flexible circuit board easily, as compared with the case where the aluminum plate is used. As a result, there is also obtained an effect that it is easy to carry out shape processing.

However, such a flexible circuit board has the following problems. That is, in a production process of the flexible circuit board, in a transportation process thereof, in a process of mounting the flexible circuit board to the housing, etc., the copper foil as the heat dissipation layer performs concave and convex deformation and loses its flatness, thus giving rise to a problem that the area of intimate contact of the heat dissipation layer to be made into intimate contact with the housing decreases (a problem of flatness). When the area of intimate contact between the heat dissipation layer and the housing decreases, the thermal resistance therebetween increases, so that it becomes impossible for heat to be conducted from the heat dissipation layer to the housing in an effective manner. As a result, the heat dissipation performance of the heat dissipation layer will decrease to a large extent. Here, note that a main factor for the concave and convex deformation of the heat dissipation layer is that the copper foil is low in elasticity and soft, and hence, the copper foil is easily deformed in a plastic manner due to an impact, etc.

Here, note that in the case of adopting a thick copper foil, if the copper foil is soft, plastic deformation or concave and convex deformation will occur easily, thus resulting in impaired flatness. In the third patent document, a technique of bonding a thick electrolytic copper foil to a wiring of a rolled copper foil for the purpose of reinforcement is disclosed, but a technical idea for maintaining the elasticity (hardness) or flatness of a copper foil is not disclosed at all.

The present invention has been made in view of the above-mentioned conventional techniques, and has for its object to provide a flexible circuit board with a heat dissipation layer on which bending processing can be carried out easily, while achieving its slimming down, and which can maintain the flatness of the heat dissipation layer.

In order to achieve the above-mentioned object, the present invention resides in a flexible circuit board which at least has a wiring layer adapted to be electrically connected to a circuit element, an insulating layer, and a heat dissipation layer, and which is characterized in that the wiring layer is formed of a copper foil which has a tensile strength of 250 MPa or less and a thickness of 50μm or less, and the heat dissipation layer is formed of a copper foil which has a tensile strength of 400 MPa or more and a thickness of 70μm or more.

According to this structure, both the wiring layer and the heat dissipation layer are formed of copper foil, and hence, bending processing can be carried out easily on the flexible circuit board, thus making it possible to work or process the flexible circuit board into a desired shape according to the shape of a housing. In addition, since both the wiring layer and the heat dissipation layer are formed of copper foil, there is no fear that one of them may warp and exfoliate in the case of a temperature rise. Accordingly, it is possible to avoid making thick an insulating adhesive layer for preventing the exfoliation, thereby making it possible to achieve the slimming down of the flexible circuit board.

Further, the heat dissipation layer is formed of the highly elastic (i.e., hard) copper foil which has a tensile strength of 400 MPa or more, and hence, in a production process of the flexible circuit board, in a transportation process thereof, in a process of mounting the flexible circuit board to the housing, etc., it is difficult for the copper foil as the heat dissipation layer to perform concave and convex deformation, thus making it possible to maintain the flatness of the heat dissipation layer. As a result, the thermal resistance between the heat dissipation layer and the housing decreases, so that it becomes possible to cause heat to escape from the heat dissipation layer to the housing in an effective manner. In addition, the heat dissipation layer functions as a reinforcing means for maintaining the shape of the flexible circuit board, thereby making it possible to stabilize the mounting position and posture of the circuit element mounted thereon.

Here, note that in cases where heating treatment is carried out in the production process of the flexible circuit board, the tensile strength of the copper foil may change with the heating treatment, but the "tensile strength" referred to herein indicates a tensile strength in a completed state of the flexible circuit board (i.e., a state thereof after receiving a heat history, in cases where the flexible circuit board is subjected to heating treatment).

In addition, it is preferable that the heat dissipation layer be formed of a copper foil having a thickness of 250μm or less.

According to this, by setting the thickness of the heat dissipation layer to be 250 μm or less, it is possible to carry out bending processing on the flexible circuit board more easily, while achieving the slimming down of the flexible circuit board.

Moreover, it is preferable that the heat dissipation layer have a first region in which the wiring layer or the insulating layer is laminated, and a second region which extends from the first region and in which the wiring layer and the insulating layer are not laminated, and that the second region be used as a heat sink region.

According to such a structure, it becomes possible to increase an amount of heat dissipation from the heat dissipation layer, by extending the heat dissipation layer to expand the surface area of the heat dissipation layer, and by using the thus expanded region (the second region) as a heat sink region. That is, it becomes possible to further improve the heat dissipation performance.

Further, it is preferable that fins be provided in the heat sink region.

According to such a structure, by the provision of the fins, the heat transfer area of the heat sink region can be increased, so that the amount of heat dissipation in the heat sink region can be further increased. That is, it becomes possible to improve the heat dissipation performance to a greater extent.

Effect of the Invention

As described above, according to the present invention, in a flexible circuit board having a heat dissipation layer, it becomes possible to provide the flexible circuit board on which bending processing is carried out easily, while achieving its slimming down, and in which the flatness of the heat dissipation layer can be maintained.

DETAILED DESCRIPTION OF THE INVENTION

Hereinafter, modes for carrying out the present invention will be described in detail by way of example with reference to the attached drawings. However, the dimensions, materials, shapes, relative arrangements and so on of component parts described in the following embodiments are not intended to limit the scope of the present invention to these alone in particular as long as there are no specific statements.

<First Embodiment>

[1-1: With Reference to Schematic Construction of Flexible Circuit Board]

Figure 1A:
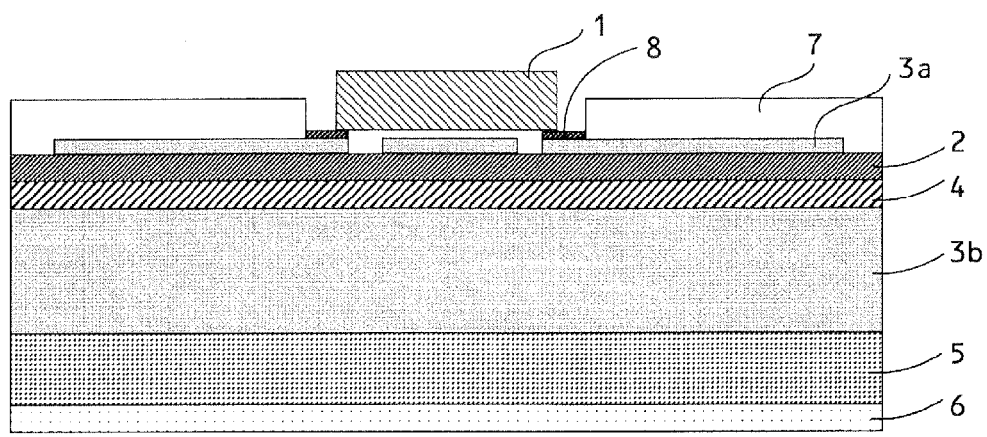
[FIG. 1] is schematic cross sectional views of a flexible circuit board according to a first embodiment of the present invention.
Figure 1B:
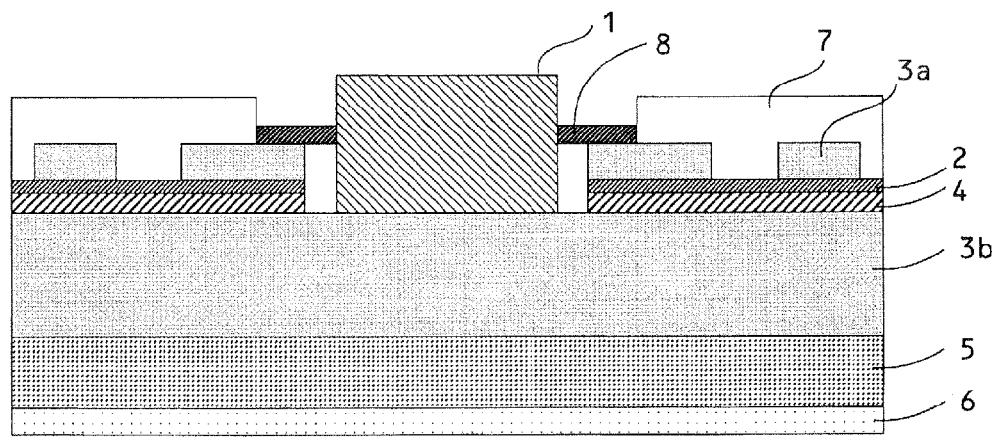

Reference will be made to the schematic construction of a flexible circuit board according to this first embodiment of the present invention, while referring to FIG. 1(a) and FIG. 1B. FIG. 1A and FIG. 1B show the schematic constructions of the flexible circuit board according to the present embodiment, respectively.

The flexible circuit board is provided, at an upper side of a heat dissipation layer 3b (with a thickness of 100 μm-150 μm), with a thermally conductive adhesive layer 4, a polyimide film 2 (an insulating layer: about 3 μm in thickness), and a wiring layer 3a (18 μm or 35 μm in thickness), which are laminated one over another in this order, and is further provided, at a lower side of the heat dissipation layer 3b, with a high thermally conductive adhesive layer 5 (about 50 μm in thickness) attached with a protector paper 6. In addition, an upper side of the wiring layer 3a is covered or coated and protected by a resist 7 (about 20 μm in thickness), while leaving land parts and connection terminal parts (these parts constituting connection parts 8). According to this, in the connection parts 8, it becomes possible to make electrical connection to a mounted circuit element and the wiring layer 3a, while protecting the wiring layer 3a from impacts, etc. Here, note that in the present embodiment, an LED 1 is adopted as the circuit element, and a white resist is adopted as the resist 7 in order to reflect light emitted from the LED 1 in a suitable manner thereby to raise brightness.

The mounting position of the LED 1 is not limited in particular, if it is a position at which the LED 1 is able to be connected to the connection parts 8 in a reliable manner. That is, as shown in FIG. 1A, the LED 1 may be mounted with a space or gap being formed between itself and the polyimide film 2, or as shown in FIG. 1B, the LED 1 may be mounted directly on an upper surface of the heat dissipation layer 3b. Here, note that in the case of the arrangement as shown in FIG. 1A, by forming the wiring layer 3a (dummy pattern) in the gap between the LED 1 and the polyimide film 2, the heat generated in the LED 1 can be conducted to the heat dissipation layer 3b through the dummy pattern in an efficient manner. In addition, as shown in FIG. 1B, when the LED 1 is directly mounted on the upper surface of the heat dissipation layer 3b, the heat generated in the LED 1 can be radiated or dissipated by means of the heat dissipation layer 3b in a more effective manner.

[1-2: With Reference to Mechanism of Heat Dissipation]

The flexible circuit board according to the present embodiment is mounted or fitted to equipment by removing the protector paper 6 and attaching or sticking the high thermally conductive adhesive layer 5 thus exposed to the housing of the equipment. When the LED 1 is electrically energized in a state where its attachment to the equipment has been completed, the heat generated in the LED 1 conducts from the wiring layer 3a to the heat dissipation layer 3b through the polyimide film 2 and the thermally conductive adhesive layer 4, diffuses in the interior of the heat dissipation layer 3b in a surface direction (i.e., in a direction orthogonal to a thickness direction), and further conducts from the heat dissipation layer 3b to the housing through the high thermally conductive adhesive layer 5 and the protector paper 6. According to this, it becomes possible to escape the heat generated in the LED 1 to the housing, and hence, it also becomes possible to cool the LED 1 in a suitable manner.

Here, in order to make low the thermal resistance in a heat transfer path which leads from the LED 1 to the housing, i.e., in order to permit the heat generated in the LED 1 to the housing in a more efficient manner, it is preferable that the adhesive layer 5 have high heat conductivity. In addition, for the same reason, it is preferable that the adhesive layer 4, which serves to adhere the polyimide film 2 and the heat dissipation layer 3b with each other, also have thermal conductivity.

[1-3: With Reference to Materials which can be Applied to Wiring Layer and Heat Dissipation Layer]

In the present embodiment, both the wiring layer 3a and the heat dissipation layer 3b are formed of copper foil. Moreover, the copper foil which forms the heat dissipation layer 3b is in a feature that it has a characteristic of a tensile strength of 400 MPa or more, at the stage after the production of the flexible circuit board. Here, detailed reference will be made to materials which are able to be applied to the wiring layer 3a and the heat dissipation layer 3b.

As the wiring layer 3a, it is possible to adopt a tough pitch copper foil (a degree of purity of 99.90% or higher), an anoxic rolled copper foil (a degree of purity of 99.96% or higher), or an electrolytic copper foil (a degree of purity of 99.90% or higher). These copper foils are low in conductor resistance, and are also low in elasticity, and are easy to be subjected to bending processing. By using such materials, and setting the thickness thereof equal to or less than 50 μm, it is possible to form the wiring layer 3a which can be deformed in a flexible manner with respect to an impact from the outside, without being fractured.

Here, note that in the present embodiment, the tensile strength of the wiring layer 3a is set to 250 MPa or less, but this tensile strength indicates a value after the flexible circuit board has been subjected to heating treatment in the production process of the flexible circuit board (to be described later), and has received heat history thereof. In general, the copper foil with high purity which is used for the wiring layer 3a, in particular rolled copper foil, has a property that it becomes annealed by being subjected to heating treatment, and the tensile strength thereof decreases. Specifically, even in the case of a copper foil with a tensile strength of 400 MPa before heating treatment, it may receive a heat history in excess of 100 degrees C. due to heating treatment, thus resulting in a tensile strength of 250 MPa or less after heating. That is, the tensile strength of the wiring layer 3a referred to herein (the heat dissipation layer 3b to be described hereinafter being also the same) indicates a tensile strength after heating treatment, i.e., after having received a heat history.

As the heat dissipation layer 3b, there is adopted a copper foil with such heat resistance that does not become dull or decreased (=the tensile strength does not decrease to a large extent) even if being subjected to heating treatment in the production process of the flexible circuit board. More specifically, a high elasticity copper foil is used which has such heat resistance that does not become dull or annealed at a thermal lamination, open cure temperature (150 degrees C.-200 degree C.). As such a high elasticity copper foil with heat resistance, there is mentioned an alloyed copper foil, and a rolled copper foil (HS1200) made by Nippon Mining & Metals Corporation is used in the present embodiment. This rolled copper foil has a property in which the tensile strength thereof does not decrease to a large extent even if the rolled copper foil receives a heat history of 300 degrees C., and hence, it becomes possible to keep the tensile strength of the heat dissipation layer 3b at 400 MPa or higher even at the stage after the production of the flexible circuit board. Here, note that if the thickness of the heat dissipation layer 3b is equal to or more than 70 µm, it is possible to radiate or dissipate the heat generated in the LED 1 to a sufficient extent, and if the thickness of the heat dissipation layer 3b is 250 µm or less, it becomes possible to carry out bending processing with respect to the flexible circuit board more easily.

Thus, by adopting the highly elastic copper foil as the heat dissipation layer 3b, it is possible to reduce the possibility that the heat dissipation layer 3b carries out concave and convex deformation and impairs or loses its flatness, in a production process of the flexible circuit board, in a transportation process thereof, in a process of mounting the flexible circuit board to the housing, etc. Accordingly, there is no fear that the area of intimate contact of the heat dissipation layer 3b to be made into intimate contact with the housing may decrease, so it becomes possible to maintain the heat dissipation performance thereof at a high level. In addition, in cases where the highly elastic copper foil is used as the heat dissipation layer 3b, the heat dissipation layer 3b functions as a reinforcing means for maintaining the shape of the flexible circuit board, so that the mounting position and posture of the LED 1 mounted on the wiring layer 3a can be made stabilized.

Here, additional reference will be made to the difference in the characteristics between the tough pitch copper foil which can be applied to the wiring layer 3a and the high elasticity copper foil which can be applied to the heat dissipation layer 3b. As stated above, the tough pitch copper foil of high purity has a characteristic that it becomes annealed by being subjected to heating treatment, and after heating, the tensile strength thereof decreases to a substantial extent. On the other hand, the high elasticity copper foil has a characteristic that it is difficult to be annealed even if being subjected to heating treatment, and hence the tensile strength thereof can not decrease easily. In the following, there are shown the changes of the "tensile strength", the "rate or percentage of elongation", and the "Young's modulus" at the time of carrying out annealing treatment (the processing of carrying out heating at 200 degrees C. for 30 minutes) with respect to the tough pitch copper foil and the high elasticity copper foil (HS1200: made by Nippon Mining & Metals Corporation).

<Tough Pitch Copper Foil (35 µm in Thickness)>
Before Annealing Treatment
Tensile strength: 450 MPa, Percentage of Elongation: 2.0%, and Young's Modulus: 105 GPa
After Annealing Treatment
Tensile strength: 230 MPa, Percentage of Elongation: 20.0%, and Young's Modulus: 105 GPa
<Tough Pitch Copper Foil (150 µm in Thickness)>
Before Annealing Treatment
Tensile Strength: 420 MPa, Percentage of Elongation: 2.0%, and Young's Modulus: 105 GPa
After Annealing Treatment
Tensile Strength: 240 MPa, Percentage of Elongation: 40.0%, and Young's Modulus: 105 GPa
<High Elasticity Copper Foil (HS1200) (150 µm in Thickness)>
Before Annealing Treatment
Tensile Strength: 520 MPa, Percentage of Elongation: 2.0%, and Young's Modulus: 105 GPa
After Annealing Treatment
Tensile Strength: 510 MPa, Percentage of Elongation: 6.0%, and Young's Modulus: 105 GPa Thus, it is understood that the tough pitch copper foil has decreased in its tensile strength to a large extent due to being subjected to heating treatment, but in contrast to this, the high elasticity copper foil has not substantially decreased in its tensile strength even if being subjected to annealing treatment. Here, note that no mention is made here, but the anoxic rolled copper foil or the electrolytic copper foil, which is a material applicable to the wiring layer 3a, also has the same characteristic as that of the tough pitch copper foil.

[1-4: With Reference To Production Process Of Flexible Circuit Board]

The production process of the flexible circuit board will be described with reference to FIGS. 2A through 2E. FIG. 2A through FIG. 2E show the production steps of the flexible circuit board in a sequential manner.

Figure 2A:
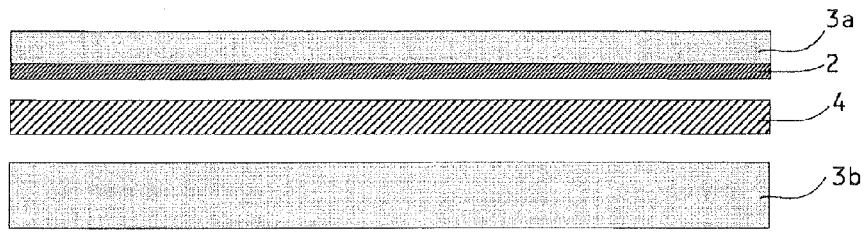
[FIG. 2] is views for explaining the production process of the flexible circuit board according to the first embodiment of the present invention.
Figure 2B:
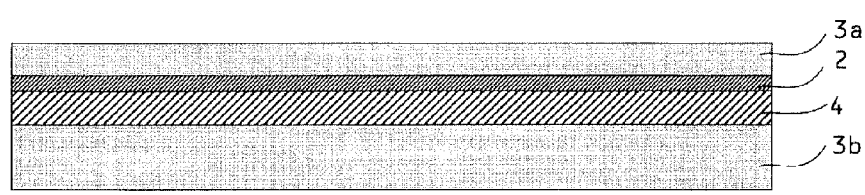

When the flexible circuit board is produced, first of all, a single-sided copper attached plate, which is formed by attaching or sticking the polyimide film 2 on one side of the copper foil 3a of low elasticity for the wiring layer, a sheet-like thermally conductive adhesive material 4, and a thick copper foil 3b of high elasticity for the heat dissipation layer are prepared (FIG. 2A). Then, the polyimide film 2 on one side of the single sided copper attached plate is laminated on the thick copper foil 3b through the thermally conductive adhesive member 4, all of which are further subjected to heating and pressurization, thereby producing a laminated body (FIG. 2B). Here, note that the thick copper foil 3b used in the present embodiment has a property that it does not become annealed even if being subjected to heating treatment in this case, as stated above.

Figure 2C:
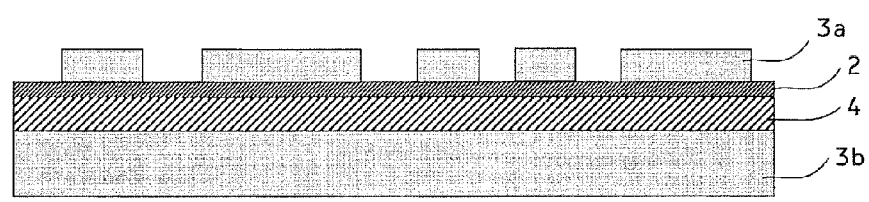
Figure 2D:
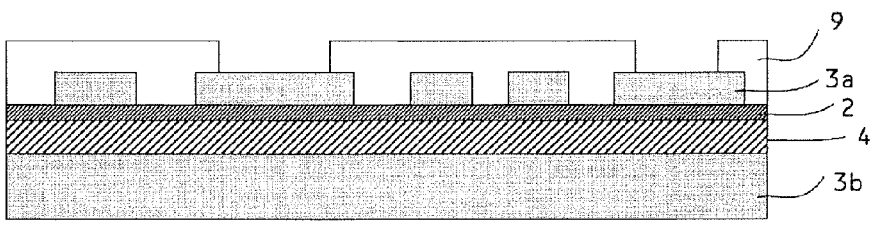

An etching resist (not shown) of a predetermined negative pattern is formed on the wiring layer 3a of the laminated body thus produced, and the copper of exposed portions of the wiring layer 3a is removed by means of etching, thereby forming a wiring pattern (FIG. 2C). As a result of this, the wiring layer 3a with the predetermined pattern is formed. Moreover, the wiring layer 3a is covered with a cover lay 9 such as a cover film, a cover coat (solder resist), or the like, except for predetermined opening portions on the wiring pattern, so that the wiring layer 3a is thereby insulated and protected (FIG. 2D).

Figure 2E:
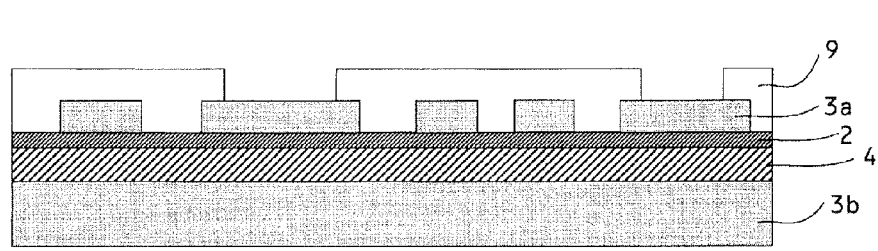

After that, the wiring pattern exposed from the cover lay 9 is subjected to an anti-corrosion treatment, or a predetermined surface treatment such as solder plating, tin plating, gold plating, etc., and circuit elements such as LEDs, ICs, etc., are mounted on the wiring pattern thus treated. In addition, shape processing is carried out on the flexible circuit board as needed, so as to provide a desired shape (FIG. 2E). According to the above production steps, a flexible circuit board having a thick copper foil as the heat dissipation layer 3b can be produced.

[1-5: With Reference To Thermal Vias]

Thermal vias (heat transfer or conduction paths) in the flexible circuit board will be described with reference to FIG. 3. The flexible circuit board according to the present embodiment can adopt an arrangement or construction which has thermal vias shown, for example, in FIGS. 3A and 3B, other than the arrangement or construction shown in FIG. 1.

Figure 3A:
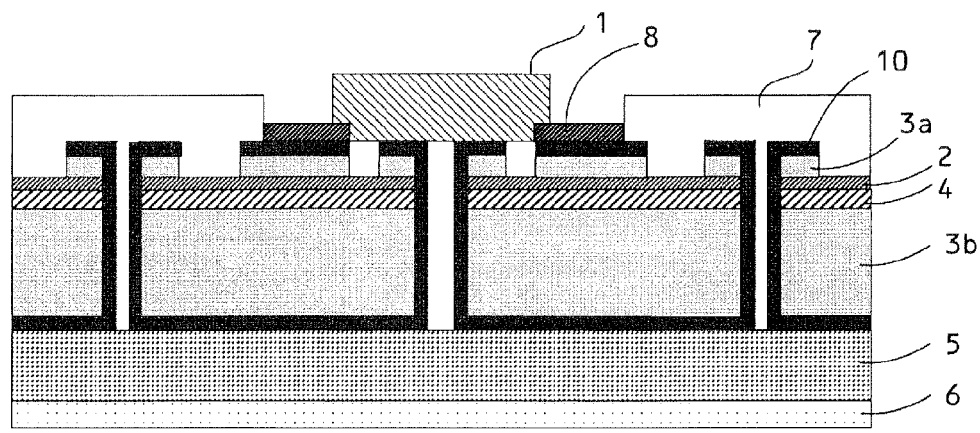
[FIG. 3] is schematic cross sectional views of a flexible circuit board according to the first embodiment of the present invention.

One form having thermal vias in the form of THs (through holes) is shown in FIG. 3A. Although the layer structure thereof is the same as that of FIG. 1(a), holes penetrating from a wiring layer 3a to a heat dissipation layer 3b are formed through by means of a NC drill, etc., and the through holes are each formed by applying thereto a copper plating 10. A thermal via in the form of a through hole is formed at a location directly under an LED 1, and the heat generated in the LED 1 can be conducted to the heat dissipation layer 3b through that through hole in an efficient manner.

Figure 3B:
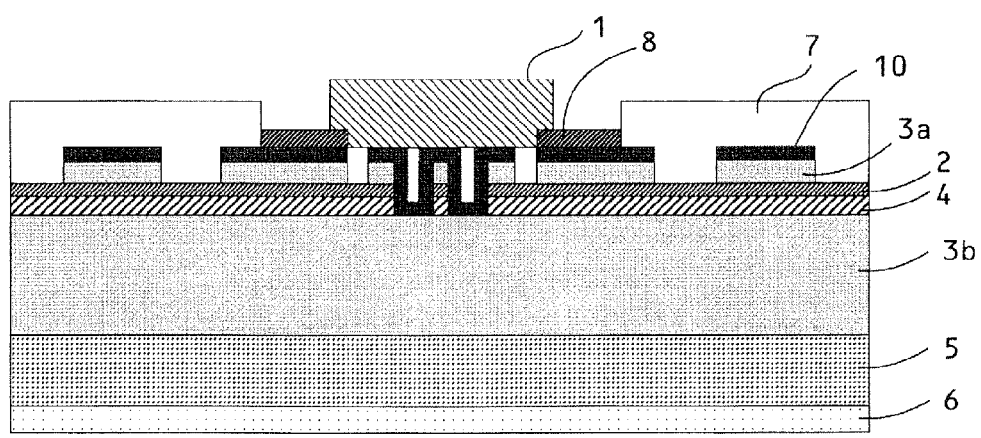

Another form having thermal vias in the form of BVHs (blind via holes) is shown in FIG. 3B. Unlike FIG. 3A, non-through holes leading to a surface of a heat dissipation layer 3b are formed by means of laser, etc., and the blind via holes are each formed by applying thereto a copper plating 10. Similar to FIG. 3A, the thermal vias in the form of the blind via holes are formed at locations directly under an LED 1, and the heat generated in the LED 1 can be conducted to the heat dissipation layer 3b through the blind via holes in an efficient manner.

[1-6: With Reference To Double-sided Structure]

Reference will be made to a flexible circuit board having a double-sided structure, while referring to FIGS. 4A and 4B. Although in the above, reference has been made to the single sided structure in which the wiring layer 3a is formed on one side of the polyimide film 2, it is possible to adopt a double-sided structure in which a pair of wiring layers 3a are formed on the opposite sides of the polyimide film 2.

Figure 4A:
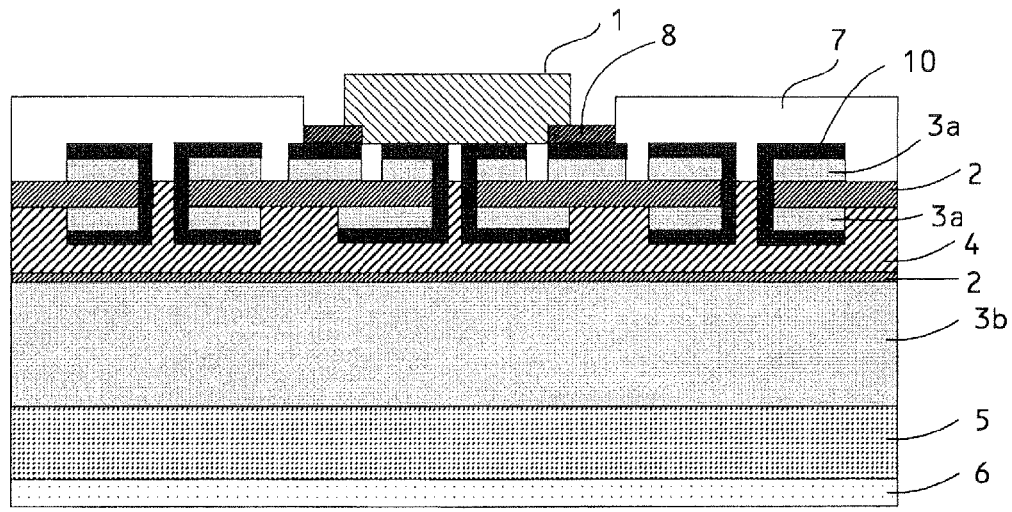
[FIG. 4] is schematic cross sectional views of a flexible circuit board according to the first embodiment of the present invention.

One form of double-sided flexible circuit board with its opposite sides connected to each other by THs (through holes) is shown in FIG. 4A. The double-sided flexible circuit board is laminated with a heat dissipation layer 3b through a thermally conductive adhesive layer 4. The heat generated in an LED 1 mounted on the double-sided flexible circuit board travels to a copper plating 10 on a back side of the double-sided flexible circuit board through the through holes, etc., from which it is further conducted to the heat dissipation layer 3b through the thermally conductive adhesive layer 4. In the illustrated form, a thin polyimide layer 2 is formed on the heat dissipation layer 3b in order to improve layer to layer insulation.

Figure 4B:
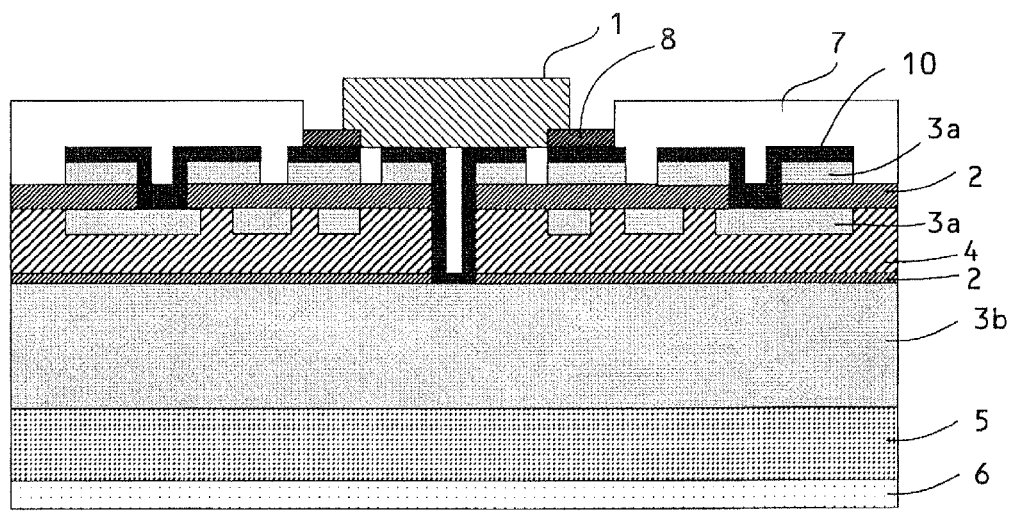

One form of double-sided flexible circuit board with its opposite sides connected to each other by BVHs (blind via holes) is shown in FIG. 4B. In the illustrated example, the blind via holes directly reaches up to the heat dissipation layer 3b, similar to FIG. 3B, so the heat generated in the LED 1 mounted on the double-sided flexible circuit board can be conducted to the heat dissipation layer 3b in a more effective manner.

[1-7: With Reference To Multilayer Structure]

Reference will be made to a flexible circuit board having a multilayer structure, while referring to FIGS. 5A and 5B. In the present embodiment, it is possible to adopt a multilayer structure in which a wiring layer 3a is formed over multiple layers.

Figure 5A:
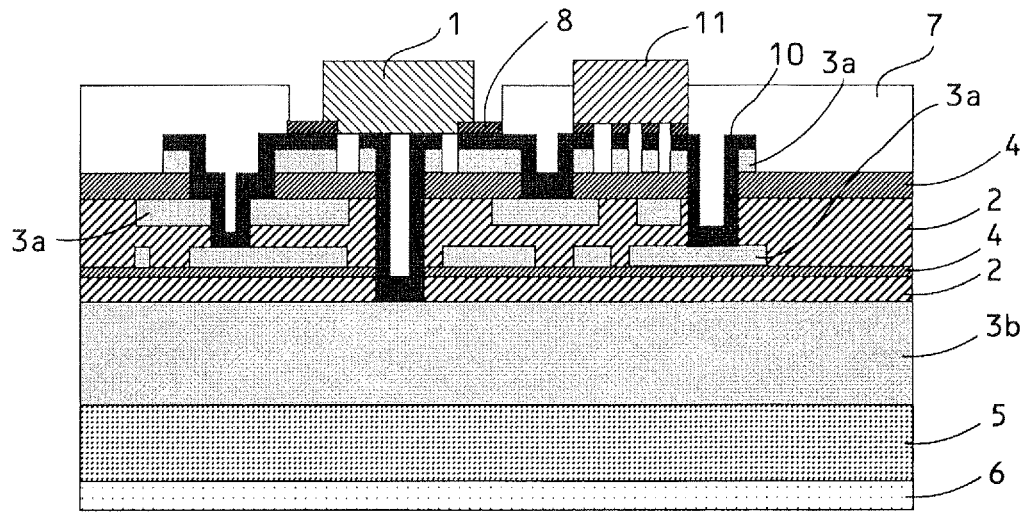
[FIG. 5] is schematic cross sectional views of a flexible circuit board according to the first embodiment of the present invention.

FIG. 5A is a form in which an LED 1 and an IC 11 are mounted on a surface. Wiring layers 3a are made of a three-layer structure, in which a wiring layer 3a is formed at an upper side of a heat dissipation layer 3b through a thermally conductive adhesive layer 4 and a polyimide film 2, and further, at an upper side of that wiring layer 3a, a double-sided flexible circuit board is laminated through an interlayer adhesive layer 4. Then, BVHs (blind via holes) for connecting the individual wiring layers 3a to one another are each formed by applying thereto a copper plating 10.

Figure 5B:
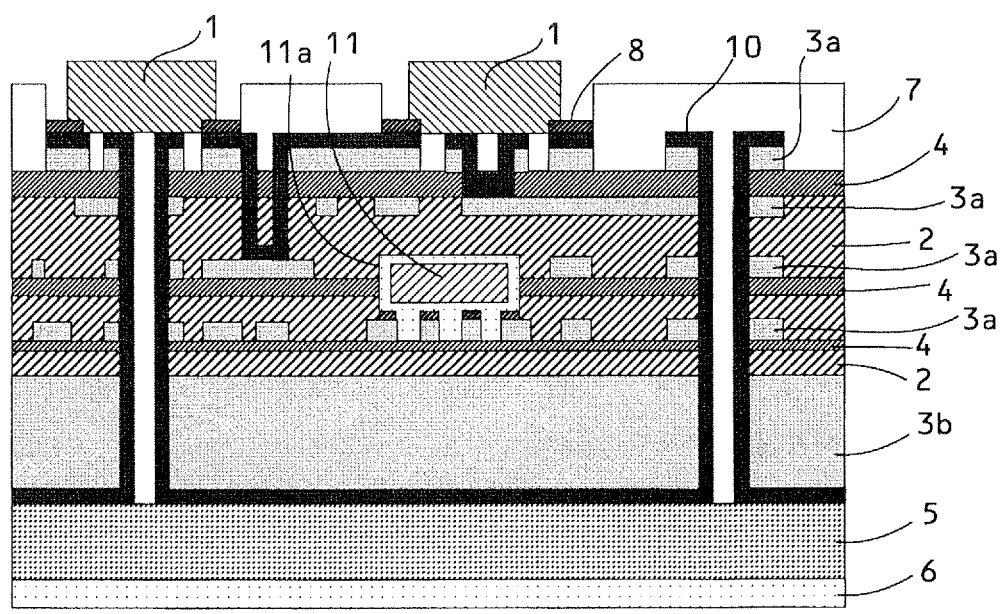

In the illustrated form, in order to form the wiring layers 3a with a high density, there are adopted a combination of many kinds of vias which include, from the left in FIG. 5B, a stepped via of a step shape which serves to connect all the wiring layers 3a to one another, a thermal via which serves to conduct the heat of the LED 1, a surface via which serves to connect the two surface layers at a front side, and a skip via which serves to connect between an outermost layer and an innermost layer. The heat generated in the LED 1 is conducted to the heat dissipation layer 3b through the thermal via in an efficient manner.

FIG. 5B shows a form in which LEDs 1 are mounted on a surface, and an IC 11 is mounted in the interior of a multilayer structure. Wiring layers 3a are made of a four-layer structure, in which a first wiring layer 3a is formed at an upper side of a heat dissipation layer 3b through a thermally conductive adhesive layer 4 and a polyimide film 2, and at an upper side of the first wiring layer 3a, a single-sided flexible circuit board having a second wiring layer 3a is laminated through a first interlayer adhesive layer 4.

The single-sided flexible circuit board and the first interlayer adhesive layer 4 are formed with a cavity at the mounting portion of an IC 11, so that the IC 11 is mounted on the first wiring layer 3a inside the cavity. The IC 11 is covered with a coat material 11a, so that the cavity is filled with the coat material without any gap. Furthermore, a double-sided flexible circuit board having a third wiring layer 3a and a fourth wiring layer 3a, which is an outermost layer, is laminated on the IC 11 through a second interlayer adhesive layer 4.

A through hole or a non-through hole is formed at a predetermined location, so that the wiring layers 3a are connected to one another by means of the TH (through hole) or BVH (blind via hole) which is formed of a copper plating 10. In the illustrated form, there are formed, from the left, a thermal via which serves to conduct the heat of an LED 1, a skip via which serves to connect the fourth wiring layer 3a and the second wiring layer 3a to each other, a surface via (thermal via) which connects the fourth wiring layer 3a and the third wiring layer 3a to each other, and a through hole which extends through all the layers. Because the IC 11 is mounted in the interior, it becomes possible to mount another circuit element on the surface in place of the IC 11. In the illustrated example, the two LED 1 are mounted.

Although not illustrated, in the above-mentioned form, it is possible to further enhance the efficiency of the heat transfer of the vias, by forming filled vias by means of via fill plating in which the inside of each via is filled up with the copper plating 10. In addition, a high heat conductivity paste may be buried or filled into each via by means of printing. Moreover, the heat dissipation layer 3b may be used as a ground plane layer.

In addition, in the flexible circuit board having a multilayer structure, a hollow structure is formed by removing a wiring layer 3a, etc., which is formed in the interior in a predetermined position, and further, the high thermally conductive adhesive layer 5 and the protector paper 6 are notched, whereby the predetermined position can be formed as a bent portion. According to this arrangement, in particular, the stress applied to the outer wiring layer 3a is reduced, so that breakage or disconnection of the wiring layer 3a can be suppressed. In addition, when there is a disagreement or difference between an angle of bend at the side of the housing and an angle of bend in the bent portion at the time of bonding or adhering the flexible circuit board onto the housing, it is possible to alleviate the disagreement or difference by the notched portions of the high thermally conductive adhesive layer 5 and the protector paper 6. Here, note that it is desirable, from the point of view of bending ease, that the number of wiring layers 3a in the bent portion be within three layers.

(1-8: Verification of Effect)

The effect of the present embodiment is verified based on the results of two verification tests (a handling test and a bent shape maintaining test) and comparative experiments made with a conventional circuit board.

(Handling Test)

(1) Test Method

A rectangular test piece was sandwiched between the thumb and forefinger of one hand of a test person by adjusting the tip of the thumb to a location about 30 mm away from the end of the center of a short side of the test piece, with the forefinger being placed to the back side thereof, and then was swung down and stopped through an angle of about 90 degrees for about 1 second, so that a change in the shape of the test piece was observed. Here, the number of test piece samples was set to be five for each type.

(2) Test Pieces

Structure: A flat plate which was formed by thermally compression-bonding a tough pitch copper foil of 35 μm in thickness, as a wiring layer, to a thick copper foil of 150 μm in thickness, as a heat dissipation layer, through an insulating layer of 28 μm (a polyimide film of 3 μm in thickness and an adhesive layer of 25 μm in thickness).

Dimensions:
Type A: 30 mm in width and 300 mm in length
Type B: 200 mm in width and 200 mm in length (3) Criterion for Evaluation (State of Deformation at Finger Root)

◉ . . . Substantially no change. ○ . . . A surface was maintained and deformed into a gently curved surface state. Δ . . . A surface was not maintained but deformed in three dimensions to some extent. x . . . A surface was not maintained but deformed in three dimensions to a large extent.

(Bent Shape Maintaining Test)

(1) Test Method

A rectangular test piece was sandwiched between the thumb and forefinger of one hand of a test person by adjusting the tip of the thumb to a location about 30 mm away from the end of the center of a short side of the test piece, with the forefinger being placed to the back side thereof, and then was swung down and stopped with a concave bent surface directed upward through an angle of about 90 degrees for about 1 second, so that a change in the angle of bend of the test piece was observed. Here, the number of test piece samples was set to be five for each type.

(2) Test Pieces

Structure: A flat plate which was formed by thermally compression-bonding a tough pitch copper foil of 35 μm in thickness, as a wiring layer, to a thick copper foil of 150 μm in thickness, as a heat dissipation layer, through an insulating layer of 28 μm (a polyimide film of 3 μm in thickness and an adhesive layer of 25 μm in thickness).

Dimensions:
Type A: 30 mm in width and 200 mm in length. A wiring surface was bent or folded at an angle of concave or valley fold of 90 degrees with an R of 1 mm in the longitudinal center of 100 mm.
Type B: 30 mm in width and 200 mm in length. A wiring surface was bent or folded at an angle of convex or mountain fold of 90 degrees with an R of 1 mm in the longitudinal center of 100 mm.

(3) Criterion for Evaluation (Difference from Angle of 90 Degrees)

◉ . . . An angle of 90 degrees is maintained. ○ . . . The difference is within an angle of 93 degrees at the maximum. Δ . . . The difference is within an angle of 110 degrees at the maximum. x . . . The difference is equal to or larger than an angle of 110 degrees.

The test results of the above-mentioned two verification tests are shown in Table 1.

TABLE 1

| Test Piece | Tensile Strength (Mpa) of Copper Foil of 150 μm | Handling Test | Bent Shape Maintaining Test | |
|---|---|---|---|---|
| | | | Wiring Surface valley Fold With Bending Angle of 90 degrees | Wiring Surface mountain Fold With Bending Angle of 90 degrees |
| Type A | 520 | ◉ | ◉ | ◉ |
| | 420 | ○ | ○ | ○ |
| | 320 | Δ | X | X |
| | 220 | X | X | X |
| Type B | 520 | ◉ | ◉ | ◉ |
| | 420 | ○ | ○ | ○ |
| | 320 | Δ | X | X |
| | 220 | X | X | X |

According to Table 1, it can be seen that when the tensile strength of the thick copper foil used for the heat dissipation layer 3b is 420 MPa, both of the type A and the type B were able to satisfy a criterion for the bent shape maintaining test, and with respect to the handling test, the type A satisfied a criterion, though a slight deformation was observed in type B. From these results, it is found that when the tensile strength of the thick copper foil is about 400 MPa or more, it is possible to deter or suppress the inadvertent occurrence of concave and convex deformation of the flexible circuit board thereby to maintain the flatness thereof, and at the same time to process the flexible circuit board into a cubic shape by means of bending. That is, the maintenance of flatness and easiness of shape processing can be made compatible with each other.

In addition, when the tensile strength of the thick copper foil is 520 MPa, in both the type A and the type B, the shape is completely maintained in the bent shape maintaining test, and in the handling test, there occurs almost no deformation in the case of the type A, and the criterion is also satisfied in the case of the type B, too. From these results, it is found that when the tensile strength of the thick copper foil is about 500 MPa or more, it is possible to make the maintenance of flatness and easiness of shape processing compatible with each other in a more suitable manner.

Then, by a conventional circuit board and the flexible circuit board according to the present embodiment with an LED having an amount of heat generation of 1.9 W being mounted on each of the circuit boards, a comparison was made between the results of temperature rises of the circuit boards at the time of electrically energizing the LEDs which were calculated from the thermal resistance values of the component members thereof. Here, a circuit board to which an aluminum plate as a heat dissipation structure was adhered or bonded was used as a comparison object. The results of the comparison are shown in the following Table 2.

TABLE 2

|  | Thickness (μm) | Coefficient of Thermal Conductivity (W/m · k) | Thermal Resistance Value (K · cm²) | Temperature Rise (° C.) |
|---|---|---|---|---|
| Interior of LED | — | — | 20 | 38 |
| LED Case Contact Surface | — | — | — | — |
| Wiring Layer | 35 | 380 | 0.01 | 0.02 |
| Polyimide Layer | 3 | 0.2 | 1.67 | 3.2 |
| Thermally conductive Adhesive Layer | 25 | 0.5 | 2.22 | 4.2 |
| Heat Dissipation Layer (Thick Copper Foil) | 150 | 340 | 0.02 | 0.03 |
| High Thermally conductive Adhesive Layer | 100 | 1.5 | 2.22 | 4.2 |
| Ambient Temperature | — | — | — | 50 |
| Total | 298 | — | 26.00 | 100 |
| Interior of LED | — | — | 20 | 38 |
| LED Case Contact Surface | — | — | — | — |
| Wiring Layer | 35 | 380 | 0.01 | 0.019 |
| Thermally conductive Adhesive Layer | 80 | 1 | 8.89 | 16.89 |
| Heat Dissipation Layer (Aluminum plate) | 1000 | 220 | 0.15 | 0.29 |
| High Thermally conductive Adhesive Layer | 100 | 1.5 | 2.22 | 4.22 |
| Ambient Temperature | — | — | — | 50 |
| Total | 1215 | — | 31.00 | 110 |

(An upper table portion is "the flexible circuit board according to the present embodiment", and a lower table portion is "the conventional circuit board")

As shown in Table 2, in the case of the flexible circuit board of the present embodiment (the upper table), a temperature rise after electrical energization of the LED is 100 degrees C., whereas in contrast to this, in the case of the conventional circuit board (the lower table), such a temperature rise is 110 degrees C. That is, it can be seen that according to the flexible circuit board of the present embodiment, the heat generated in the LED can be dissipated or radiated in a more effective manner. It is generally known that when the temperature of the LED falls by 10 degrees C., the life span thereof will be extended about twice. Accordingly, it can be understood that if the flexible circuit board according to the present embodiment is used, the life span of the LED will be extended. In addition, with respect to the thickness of each circuit board as a whole, the flexible circuit board according to the present embodiment is substantially thinner, as compared with the conventional circuit board. That is, according to the present embodiment, it becomes possible for the inventive flexible circuit board to exhibit heat dissipation performance superior to that of the conventional circuit board, while achieving slimming down thereof. As a result, it becomes possible to achieve the reduction in size of the circuit board and the equipment on which the circuit board is mounted, as well as the extension of the life spans of circuit elements mounted thereon.

[1-9: Effect of the Present Embodiment]

According to the present embodiment, both the wiring layer 3a and the heat dissipation layer 3b are formed of copper foil, so that it becomes possible to work or process the flexible circuit board into a desired shape in an easy manner according to the shape of equipment on which the flexible circuit board is to be mounted. In addition, the thickness of the heat dissipation layer 3b can be made thinner as compared with the conventional construction, thus making it possible to achieve slimming down of the flexible circuit board.

Moreover, the heat dissipation layer 3b is formed of a highly elastic thick copper foil which has a tensile strength of 400 MPa or more, and a thickness of 70 μm or more, and hence, there is no fear that the heat dissipation layer 3b may perform concave and convex deformation, in the production process of the flexible circuit board, in the transportation process thereof, in the process of mounting the flexible circuit board to the housing, or the like. That is, the flatness of the heat dissipation layer 3b can be maintained, so that it becomes possible to keep the heat dissipation performance of the flexible circuit board at a high level.

As described above, according to the present embodiment, in a flexible circuit board having a heat dissipation layer, it becomes possible to provide the flexible circuit board on which bending processing is carried out easily, while achieving its slimming down, in which the flatness of the heat dissipation layer can be maintained.

<Second Embodiment>

Reference will be made to a second embodiment to which the present invention can be applied, while referring to FIGS. 6A through 6C and FIGS. 7A and 7B. The layer structure of a flexible circuit board according to this second embodiment is the same as that of the first embodiment, so the description thereof is omitted, and here, only differences of this second embodiment from the first embodiment will be explained.

[2-1: With Reference To Heat Sink]

Figure 6A:
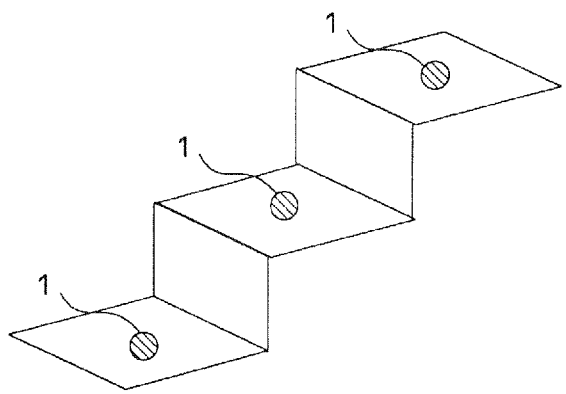
[FIG. 6] is schematic construction views of a flexible circuit board according to a second embodiment of the present invention.

FIG. 6A shows one form of the flexible circuit board according to the first embodiment. Because bending processing can be carried out on the flexible circuit board according to the first embodiment in an easy manner, as stated above, the flexible circuit board can be processed into a stepped or staircase shape as illustrated in this figure, for example. The flexible circuit board of such a shape can be applied to a front lamp of an automobile, etc., for example.

Figure 6B:
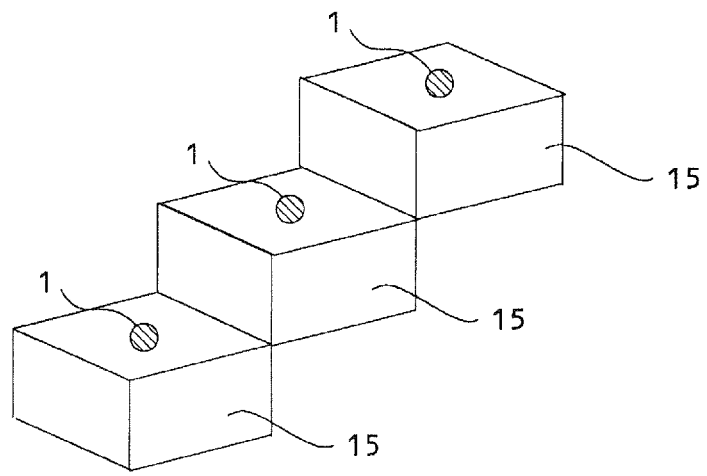

FIG. 6B shows the schematic structure of the flexible circuit board according to this second embodiment. As illustrated, the flexible circuit board is formed with a first region in a heat dissipation layer 3b in which a wiring layer, etc., is laminated, and a second region 15 in which only the heat dissipation layer 3b is expanded from the first region. According to this, it becomes possible to increase an amount of heat dissipation from the heat dissipation layer 3b, by extending the heat dissipation layer 3b to expand the surface area of the heat dissipation layer 3b and using the thus expanded region (the second region 15) as a heat sink region. That is, it becomes possible to improve the heat dissipation performance to a more extent.

Figure 6C:
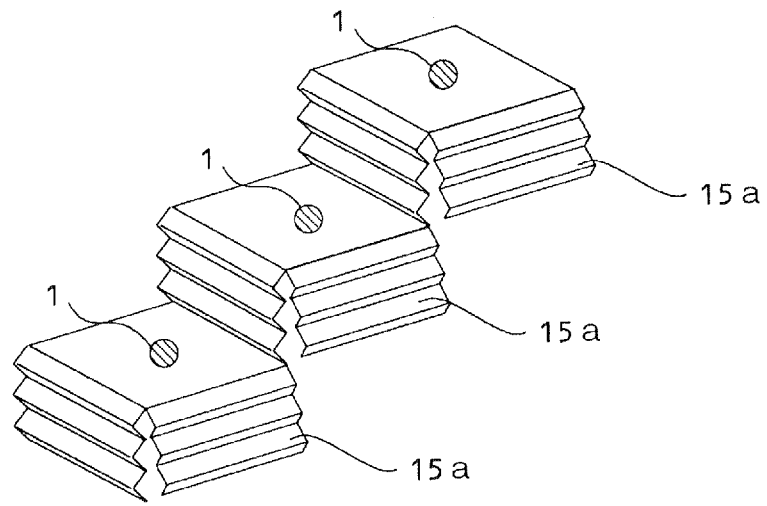

Further, as shown in FIG. 6C, fins 15a in which mountain folds and valley folds are made may be arranged in the heat sink region. According to such a structure, by the provision of the fins 15a, the heat transfer area of the heat sink region can be increased, and hence, the amount of heat dissipation in the heat sink region can be further increased. That is, it becomes possible to improve the heat dissipation performance to a further extent.

[2-2: With Reference To Production Process]

Figure 7A:
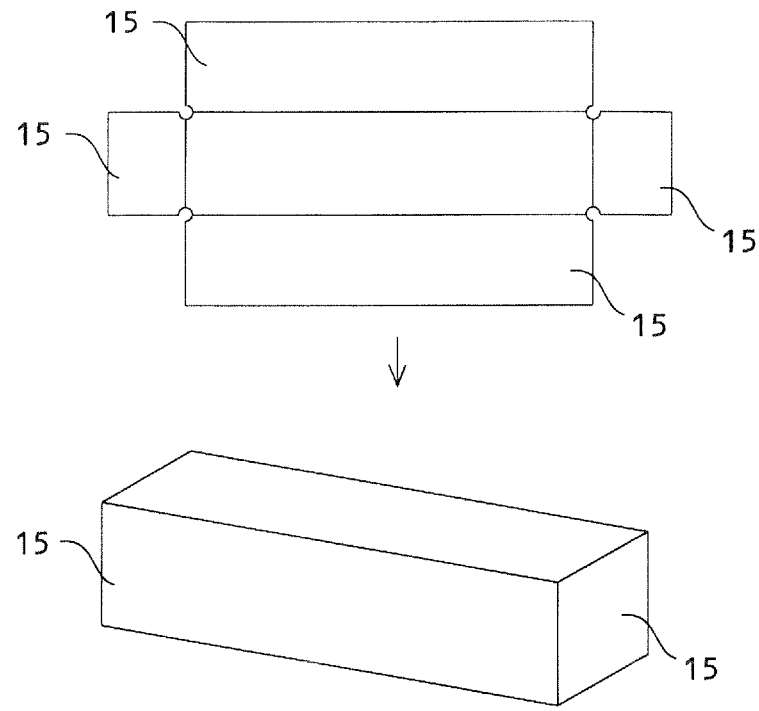
[FIG. 7] is views for explaining assembly of a flexible circuit board according to the second embodiment of the present invention.
Figure 7B:
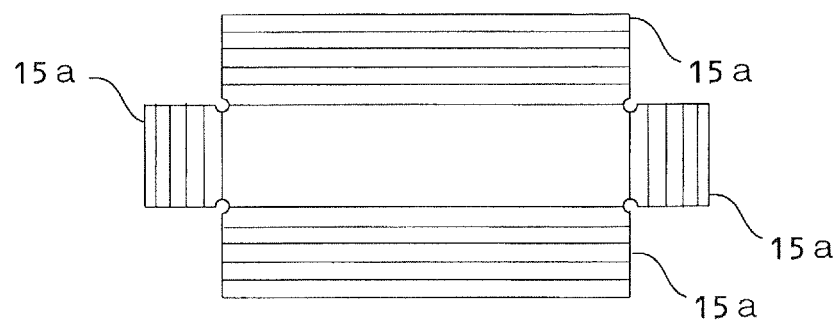

In FIGS. 7A through 7C, there is shown a production process of the flexible circuit board according to this second embodiment of the present invention. As shown in FIG. 7A, by bending or folding root portions of extension portions of the heat dissipation layer 3b which are extended on all sides, a heat sink region can be formed by the regions thus bent or folded. Here, note that circular holes or notches in the bent portions at four corners are formed in order to prevent cracks. In addition, as shown in FIG. 7B, the heat sink region provided with the fins 15a can be formed by applying mountain folds and valley folds to the extension portions of the heat dissipation layer 3b extended on all sides, respectively.

As described above, according to this second embodiment, in a flexible circuit board having a heat dissipation layer, it becomes possible to provide the flexible circuit board on which bending processing is carried out easily, while achieving its slimming down, in which the flatness of the heat dissipation layer can be maintained. In addition, by the provision of a heat sink region and also the fins, it becomes possible to further improve the heat dissipation performance of the heat dissipation layer.

[Other Embodiments]

Although in the first and second embodiments, an explanation has been given to the structures in which the polyimide film 2 is used as a substrate, materials which can be applied as the substrate are not limited to this. It is possible to adopt other materials as the substrate, as long as they can be subjected to bending or folding deformation.

In addition, although in first and second embodiments, an explanation has been given to the arrangements in which the LED 1 and the IC 11 are used as the circuit elements, elements which can be applied as the circuit elements are not limited to these. Other than these, it is also possible to use semiconductor devices such as a CPU, etc. The data processing speeds of CPUs and semiconductors for ICs for liquid crystal drivers are becoming dramatically faster and faster in accordance with the increasing operating speeds thereof, so that higher heat dissipation performance is required for flexible circuit boards on which they are mounted. In this case, too, it becomes possible to obtain the same effects as stated above.

EXPLANATION OF REFERENCE NUMERALS AND CHARACTERS

1 . . . circuit element(s), 2 . . . polyimide layer(s), 3a . . . wiring layer(s), 3b heat dissipation layer, 4 . . . thermally conductive adhesive layer(s), 5 . . . high thermally conductive adhesive layer, 6 . . . protector paper, 7 . . . resist, 8 . . . connection parts, 10 . . . copper plating.

The invention claimed is:

1. A flexible circuit board which at least has a wiring layer adapted to be electrically connected to a circuit element, an insulating layer, and a heat dissipation layer, wherein
    said wiring layer is formed of a copper foil which has a tensile strength of 250 MPa or less and a thickness of 50 μm or less; and
    said heat dissipation layer is formed of a copper foil which has a tensile strength of 400 MPa or more and a thickness of 70 μm or more, and is subjected to bending processing.

2. The flexible circuit board as set forth in claim 1, wherein said heat dissipation layer is formed of a copper foil having a thickness of 250 μm or less.

3. The flexible circuit board as set forth in claim 1, wherein said heat dissipation layer has a first region in which said wiring layer or said insulating layer is laminated, and a second region which extends from said first region and in which said wiring layer and said insulating layer are not laminated, wherein said second region is used as a heat sink region.

4. The flexible circuit board as set forth in claim 1, wherein the fins are provided in said heat sink region, said fins being formed by making mountain folds and valley folds.

5. The flexible circuit board as set forth in claim 2, wherein said heat dissipation layer has a first region in which said wiring layer or said insulating layer is laminated, and a second region which extends from said first region and in which said wiring layer and said insulating layer are not laminated, wherein said second region is used as a heat sink region.

6. The flexible circuit board as set forth in claim 2, wherein the fins are provided in said heat sink region, said fins being formed by making mountain folds and valley folds.

7. The flexible circuit board as set forth in claim 3, wherein the fins are provided in said heat sink region, said fins being formed by making mountain folds and valley folds.

* * * * *